United States Patent [19]

Nagaraj et al.

[11] Patent Number: 5,336,639

[45] Date of Patent: Aug. 9, 1994

[54] METHOD FOR SECURING A SEMICONDUCTOR CHIP TO A LEADFRAME

[75] Inventors: Benamanahalli K. Nagaraj; Vern Hause, both of Phoenix, Ariz.

[73] Assignee: Motorola, Inc., Schaumburg, Ill.

[21] Appl. No.: 82,642

[22] Filed: Jun. 28, 1993

[51] Int. Cl.[5] .......................................... H01L 21/60
[52] U.S. Cl. .................................. 437/217; 437/209; 437/211; 437/215; 437/220
[58] Field of Search ................ 437/217, 209, 211, 215, 437/220; 257/676, 669, 668, 727, 782, 180

[56] References Cited

U.S. PATENT DOCUMENTS

| | | |
|---|---|---|
| 3,766,977 | 10/1973 | Pravda et al. |
| 4,816,427 | 3/1989 | Dennis .................... 437/220 |
| 4,893,172 | 1/1990 | Matsumoto et al. .......... 257/669 |
| 4,979,289 | 12/1990 | Dunaway et al. ........... 257/782 |
| 5,081,067 | 1/1992 | Shimizu et al. ............ 437/215 |
| 5,166,774 | 11/1992 | Banerji et al. ............ 257/668 |
| 5,198,391 | 3/1993 | Rösel et al. ............. 437/220 |
| 5,202,288 | 4/1993 | Doering et al. ........... 437/220 |

Primary Examiner—Tom Thomas
Assistant Examiner—Kevin M. Picardat
Attorney, Agent, or Firm—Rennie W. Dover

[57] ABSTRACT

A semiconductor chip (26) is attached to a leadframe (20, 30, 40). The leadframe (20, 30, 40) has an opening (24) or a cavity (34, 44) for receiving the semiconductor chip (26). The opening (24) or the cavity (34, 44) and the semiconductor chip (26) have corresponding shapes. The opening (24) or the cavity (34, 44) is made such that they are smaller than the size of the semiconductor chip (26) at room temperature. The opening (24) or the cavity (34, 44) is expanded and the semiconductor chip (26) is placed in the opening (24) or the cavity (34, 44). Subsequent to placing the semiconductor chip (26) in the opening (24) or the cavity (34, 44), the leadframe (20, 30, 40) is cooled so that an edge (25) of the leadframe grips a corresponding edge (29) of the semiconductor chip (26).

17 Claims, 2 Drawing Sheets

METHOD FOR SECURING A SEMICONDUCTOR CHIP TO A LEADFRAME

BACKGROUND OF THE INVENTION

The present invention relates, in general, to securing semiconductor chips to leadframes, and more particularly, to methods for nonadhesively securing semiconductor chips to leadframes.

An integral step in packaging a semiconductor chip is securing or attaching the semiconductor chip to a leadframe. Typically, the back side of the semiconductor chip is bonded to the leadframe or a heatsink using an adhesive agent such as an epoxy die attach material or a lead based solder. Subsequently, the die attach material is cured, and the semiconductor chip is encapsulated by a molding compound to form a packaged semiconductor chip.

Although this technique is widely used for encapsulating semiconductor chips, it suffers from several drawbacks. For example, during the step of curing the epoxy die attach material an organic solvent is released or outgassed from the epoxy die attach material. The outgassed organic solvent forms a layer of organic contaminants on the semiconductor chip and leadframe that weakens the bond between the semiconductor chip and the leadframe. The weakened bond may result in delamination of the molding compound from the semiconductor chip, the leadframe, or both. Delamination often leads to solder reflow cracking of a plastic package when moisture is present on the semiconductor chip and the plastic package is subjected to thermal shock such as occurs when soldering a surface mount device to a printed circuit board. Solder fellow cracking is also referred to as "popcorn" cracking. Further, semiconductor chip tilting may occur with the use of adhesive die attach materials. Lead based solders, on the other hand, pose an environmental hazard.

Accordingly, it would be advantageous to have a method for securing a semiconductor chip to a leadframe that eliminates the use of adhesive materials. Moreover, the method should secure the semiconductor chip to the leadframe in such a manner as to preclude the occurrence of semiconductor chip tilting. It would be of further advantage for the method to be compatible with environmentally safe manufacturing techniques.

SUMMARY OF THE INVENTION

Briefly stated, the present invention is a method for gripping a semiconductor substrate and thus securing the semiconductor substrate to a support such as a leadframe. The method includes providing the semiconductor substrate having a major surface and an edge, and providing the support, wherein the support has a major surface and a receptacle having an edge for gripping the edge of the semiconductor substrate. Subsequently, the method entails placing the semiconductor substrate in said receptacle and gripping the edge of the semiconductor substrate with the edge of the receptacle.

DETAILED DESCRIPTION OF THE DRAWINGS

Figure 1:
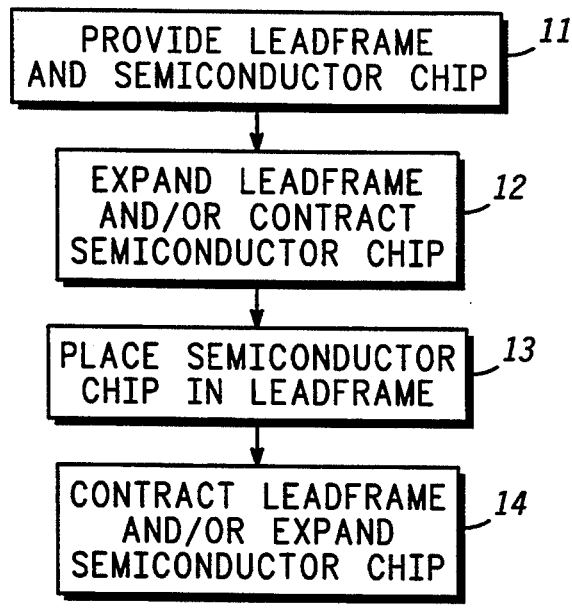
FIG. 1 illustrates a flow diagram of a method for attaching a semiconductor chip to a leadframe in accordance with the present invention.
Figure 2:
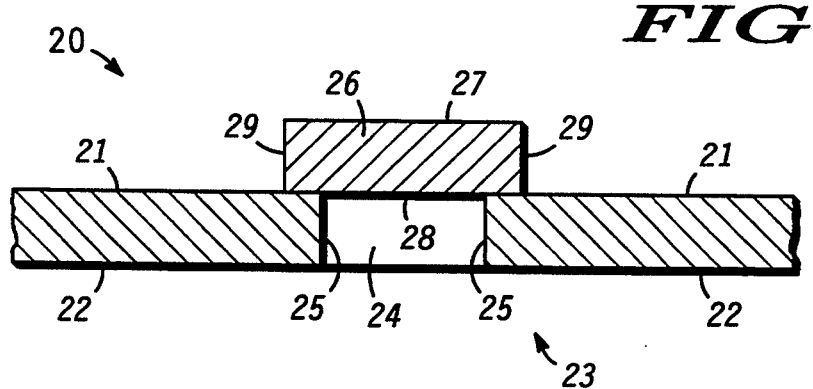
FIG. 2 illustrates a highly enlarged cross-sectional view of an embodiment of a leadframe in accordance with the present invention.
Figure 3:
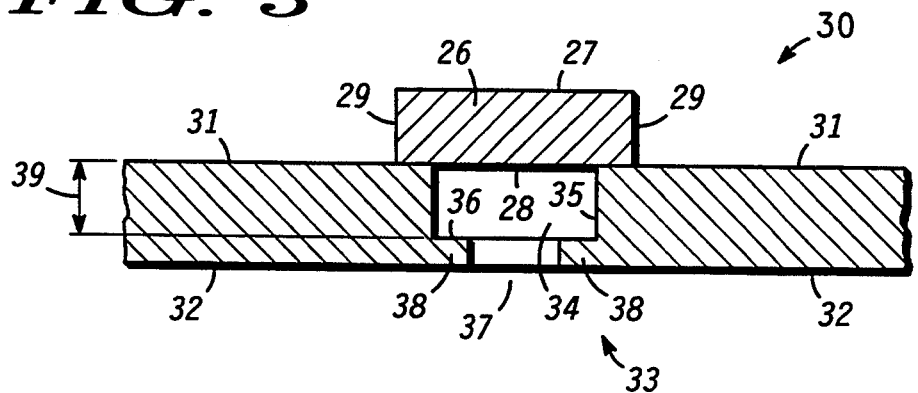
FIG. 3 illustrates a highly enlarged cross-sectional view of another embodiment of a leadframe in accordance with the present invention.
Figure 4:
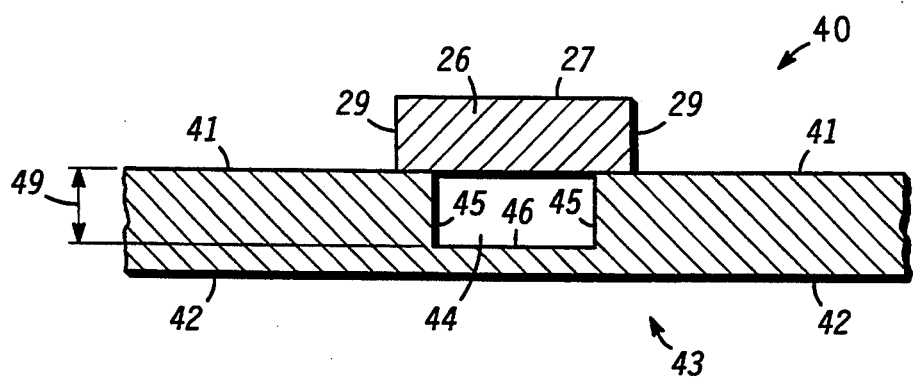
FIG. 4 illustrates a highly enlarged cross-sectional view of yet another embodiment of a leadframe in accordance with the present invention.

FIG. 1 illustrates a flow diagram 10 of a method for attaching a semiconductor chip to a leadframe in accordance with the present invention. In a first step (indicated by reference numeral 11), a leadframe and a semiconductor substrate, such as a semiconductor chip, are provided. Various embodiments of the semiconductor chip and the leadframe are illustrated in FIGS. 2–4. It shall be understood that the present invention is not limited to attaching a semiconductor chip to a leadframe, but is also useful for securing a semiconductor substrate to a support having an elastic property, i.e., a support that can be expanded or contracted. As those skilled in the art are well aware, semiconductor chips are also referred to as semiconductor die, pellets, etc.

To facilitate understanding the present invention, FIGS. 2–4 are described prior to continuing the description of flow diagram 10. FIGS. 2–4 illustrate highly enlarged cross-sectional views of a portion of a leadframe having a die attach region in accordance with the present invention. The die attach region is commonly referred to as a flag and serves as a region to which a semiconductor chip is attached. The die attach region may be a heatsink. Preferably the leadframe is a metallic material having a coefficient of thermal expansion greater than the coefficient of thermal expansion of a semiconductor chip. By way of example, the leadframe is copper and the semiconductor chip is silicon, wherein the ratio of the coefficient of thermal expansion (CTE) of copper to the coefficient of thermal expansion (CTE) of silicon is approximately five, i.e., the CTE for copper is approximately 16 parts per million per °C. (ppm per °C.) and the CTE for silicon is approximately 3 ppm per °C. Other suitable materials for the leadframe include, alloys of copper, beryllium copper, aluminum, alloys of aluminum, etc., whereas other suitable materials for the semiconductor chip include semiconductor substrate materials such as germanium, gallium arsenide, indium phosphide, or the like. Leadframe and semiconductor substrate materials are well known to those skilled in the art.

FIG. 2 illustrates a first embodiment of a portion of a support such as a leadframe 20 having a top or first major surface 21, a bottom or second major surface 22, and a die attach region 23. Die attach region 23 serves as a semiconductor chip receiving region and has an opening 24 extending through die attach region 23 of leadframe 20 (i.e., from top surface 21 to bottom surface 22), wherein opening 24 is laterally bounded by edges 25. Opening 24 is a receptacle having edges 25 for gripping edges 29 of a semiconductor substrate 26 and serves as a semiconductor chip receiving cavity. Thus, opening 24 has a first area and semiconductor substrate 26 has a second area, wherein the second area is larger than the first area. In addition, FIG. 2 illustrates semiconductor substrate 26 as a rectangular shaped semiconductor chip having a front or major surface 27, a back or major surface 28, and that is bounded along a periphery by edges 29. More particularly, edges 29 are comprised of two sets of opposing edges. Preferably, a thickness of leadframe 20 in die attach region 23 is approximately the same as a thickness of semiconductor chip 26. Further, the shape of opening 24 corresponds to the shape of semiconductor chip 26. In other words, opening 24 is a rectangle having opposing edges for rectangular shaped semiconductor chips 26, a circle for circular shaped semiconductor chips, etc. Accordingly, a rectangular opening 24 is bounded by four edges 25 and a semiconductor chip 26 has four edges 29 that correspond to edges 25. Preferably, top surface 21 is co-planar with front surface 27, and bottom surface 22 is co-planar with back surface 28 when semiconductor chip 26 is secured or attached to leadframe 20.

Opening 24 may be formed using commonly known techniques such as laser milling, stamping, punching, etc. The method for forming openings such as opening 24 is not a limitation of the present invention. The dimensions of opening 24 are selected such that, at room temperature, a compressive stress of at least 75 MegaPascals exists between edges 29 of semiconductor substrate 26. Thus, edges 25 of leadframe 20 grip corresponding edges 29 of semiconductor chip 26. For the rectangularly shaped semiconductor chip 26 and the rectangular shaped opening 24, two opposing edges of semiconductor chip 26 are gripped by corresponding edges of the two opposing edges of opening 24. Preferably, the compressive stress on semiconductor chip 26 is between approximately 100 and approximately 200 MegaPascals at room temperature. It shall be understood that silicon, having unscratched major surfaces 27 and 28, can withstand compressive stresses along edges 29 of up to about 4,500 MegaPascals, and thus the dimensions of opening 24 may be selected to provide a maximum compressive stress of up to about 4,500 MegaPascals. Those skilled in the art are aware that 1 Pascal is equivalent to 1 Newton per square meter. The steps for securing semiconductor chip 26 to die attach region 23, and more particularly inserting semiconductor chip 26 into opening 24, are further discussed infra.

FIG. 3 illustrates a second embodiment of a portion of a leadframe 30, wherein leadframe 30 has a top or first major surface 31, a bottom or second major surface 32, and a die attach region 33. Die attach region 33 comprises a semiconductor chip receiving cavity or recess 34 laterally bounded by edges or walls 35. In addition, a floor 36 of cavity 34 has an aperture or opening 37 extending through floor 36 to bottom surface 32. Described in different terms, floor 36 comprises lips or cantilever structures 38 extending from edges 35 adjacent bottom surface 32 into cavity 34. The shape of cavity 34 corresponds to the shape of semiconductor chip 26. It shall be understood that the same reference numerals are used in the figures to denote the same elements. The insertion of semiconductor chip 26 into semiconductor chip receiving cavity or recess 34 will be discussed hereinafter.

FIG. 4 illustrates a third embodiment of a portion of a leadframe 40, wherein leadframe 40 has a top or first major surface 41, a bottom or second major surface 42, and a die attach region 43. Die attach region 43 comprises a cavity or recess 44 laterally bounded by edges or walls 45. The shape of cavity 44 corresponds to the shape of semiconductor chip 26. Further, cavity 44 has a floor 46. Cavities 34 of FIG. 3 and cavities 44 of FIG. 4 are formed using those methods described for forming opening 24 of FIG. 1. The method for determining the dimensions of opening 24 and cavities 34 and 44 are described with reference to leadframe expansion step 12 shown in flow diagram 10 of FIG. 1.

Preferably a thickness of semiconductor chip 26 is equal to a distance from top surface 31 to floor 36 of the second embodiment (FIG. 3), or equal to a distance from top surface 41 to floor 46 of the third embodiment (FIG. 4). In other words, the thickness of semiconductor chip 26 and the distances indicated by arrows 39 and 49 of FIGS. 3 and 4, respectively, are selected such that top surface 31 is co-planar with front surface 27 when semiconductor chip 26 rests on floor 36 and is secured or attached to leadframe 30 in the embodiment of FIG. 3, or top surface 41 is co-planar with front surface 27 when semiconductor chip 26 rests on floor 46 and is secured or attached to leadframe 40 in the embodiment of FIG. 4. Although it is preferable to have top surfaces 31 and 41 co-planar with front surface 27, in the second and third embodiments, respectively, as well as to have top surface 21 co-planar with front surface 27 and bottom surface 22 co-planar with back surface 28 in the first embodiment, it shall be understood that die attach region 23 may be thinner than semiconductor chip 26. More particularly, and in accordance with the present invention, die attach region 23 may have a thickness of at least 75% of a thickness of semiconductor chip 26 and still sufficiently grip semiconductor chip 26.

Referring again to FIG. 1, the leadframe 20, 30, or 40 is expanded as indicated by reference numeral 12, thereby expanding or enlarging opening 24 (or cavities 34 and 44). To avoid confusion, the method of the present invention shall be described with respect to the first embodiment shown in FIG. 2, but shall be understood to include other embodiments. In other words, reference to leadframe 20 shall be taken to mean leadframe 20, leadframe 30, or leadframe 40, and reference to opening 24 shall be taken to mean opening 24, cavity 34, or cavity 44, wherein opening 24 corresponds to leadframe 20, cavity 34 corresponds to leadframe 30 and cavity 44 corresponds to leadframe 40.

The dimensions for opening 24 are determined in accordance with the method used for expanding leadframe 20. Preferably leadframe 20 and opening 24 are uniformly expanded by heating leadframe 20. For heating leadframe 20, wherein leadframe 20 has a square opening 24 in a square die attach region 23, the following equation applies:

$$\delta = \frac{bp}{E_o} \left( \frac{b^2 + c^2}{c^2 - b^2} + \mu_o \right) + \frac{bp}{E_i} (1 - \mu_i)$$

wherein the variables are defined as follows:
  $\delta$: difference between the corresponding central line segment lengths of the semiconductor chip and the inner line segment length of the opening (meters);
  p: compressive stress at the interface on the edges of the semiconductor chip (Pascals);
  $E_i$: modulus of elasticity of the semiconductor chip (Pascals);

$E_o$: modulus of elasticity of the leadframe (Pascals);
b: central line segment length of the semiconductor chip (meters);
c: outer line segment length of the die attach region (meters);
$\mu_i$: Poisson's ratio for the semiconductor chip; and
$\mu_o$: Poisson's ratio for the leadframe.

Figure 5:
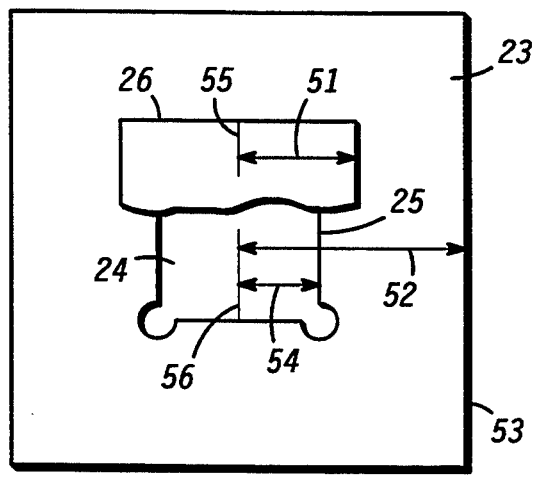
FIG. 5 illustrates a plan view of a die attach region and a portion of a semiconductor chip in accordance with the present invention.

To more fully explain the definitions of the variables in the aforementioned equation, FIG. 5 illustrates the line segments defined by the variables "b," "c," and "i," supra, as line segments having arrows at each end. In particular, FIG. 5 is a plan view of die attach region 23 having semiconductor chip 26 resting thereon, wherein semiconductor chip 26 is shown as partially cutaway, to better illustrate the relative dimensions. A line segment 51 having arrows at each end denotes variable "b," and is also referred to as central line segment 51. Central line segment 51 extends from an imaginary reference line 55 that bisects semiconductor chip 26 to edge 29 of semiconductor chip 26, forming a perpendicular intersection with imaginary reference line 55 and edge 29. A line segment 52 having arrows at each end denotes variable "c," which is also referred to as the outer line segment 52. Outer line segment 52 extends from an imaginary reference line 56 that bisects opening 24 to an outer edge 53 of flag or die attach region 23, forming a perpendicular intersection with imaginary reference line 56 and outer edge 53. In addition, FIG. 5 includes a line segment 54 having arrows at each end which denotes variable "i," and is also referred to as the inner line segment 54. Inner line segment 54 extends from imaginary reference line 56 to the edge 25, forming a perpendicular intersection with imaginary reference line 56 and edge 25.

The difference between the length of the central line segment length 51, i.e., variable "b," of semiconductor chip 26 and the corresponding inner line segment length 54, i.e., variable "i," of opening 24 is calculated using the aforementioned equation. By way of example, assume semiconductor chip 26 is a silicon semiconductor material having a central line segment 51 of length 5 millimeters (mm), and the leadframe is copper having a square die attach region 23 having an outer line segment 52 of length 10 mm. Silicon has a modulus of elasticity ($E_i$) of 170 GigaPascals (GPa) and a Poisson ratio ($\mu_i$) of 0.26. Copper has a modulus of elasticity ($E_o$) of 130 GPa and a Poisson ratio ($\mu_o$) of 0.34. Thus, for a square semiconductor chip and a compressire stress of approximately 100 MegaPascals between opposing edges 29 of semiconductor substrate 26, the aforementioned equation yields a value for $\delta$ of approximately 0.01 mm. In other words, the length of inner line segment 54 is made to be shorter than the length of central line segment 51 by approximately 0.01 mm, i.e., the length of central line segment 51 in the example is approximately 4.99 mm. In other words, the lengths of the sides of openings 24 are 9.98 mm.

The aforementioned equation applies to circular semiconductor chips and circular openings by substituting the radius of the semiconductor chip for the central line segment length, the outer radius of the die attach region for the outer line segment length, and the radius of the opening for the inner line segment length. Further, the equation can be modified to accommodate shapes for the semiconductor chip and the die attach regions other than square and circular.

Having determined the dimensions and formed opening 24 to yield a compressive stress of approximately 100 MegaPascals, leadframe 20 is heated thereby expanding leadframe 20 and opening 24. The minimum temperature required to sufficiently expand leadframe 20 and thus permit insertion of semiconductor chip 26 into opening 24 is expressed mathematically as:

$$T_o = \frac{u}{ia_o} \simeq \frac{\delta}{ia_o}$$

wherein the variables are defined as follows:
u: displacement at inner line segment for uniform temperature rise (meters);
$a_o$: coefficient of thermal expansion (parts per million per °C.);
i: length of the inner line segment (meters);
$T_o$: temperature rise above room temperature to which a support must be elevated (°C.); and
$\delta$: difference between the corresponding central line segment lengths of the semiconductor chip and the inner line segment length of the opening (meters).

Thus for the numeric example presented hereinbefore, the minimum temperature to which leadframe 20 must be elevated is approximately 125° C. greater than room temperature. This temperature allows sufficient expansion of leadframe 20 so that semiconductor chip 26 can fit into opening 24. In other words, the area of opening 24 is increased to a third area such that the third area is larger than the second area, i.e., the area of semiconductor chip 26. It shall be understood that the size of opening 24 is calculated to provide sufficient gripping of semiconductor chip 26 under worst case temperature conditions. Thus, when it is anticipated that the leadframe will encounter temperatures rise greater than 125° C. above room temperature, then opening 24 is made smaller, in accordance with the present invention.

Further, semiconductor chip 26 may be contracted or shrunk by, for example, cooling prior to insertion into opening 24. After insertion of semiconductor 26 into opening 24, semiconductor 26 is expanded by, for example, heating. As those skilled in the art are aware, shrinking semiconductor chip 26 decreases the amount that leadframe 20 must be expanded and therefore lowers the temperature to which leadframe 20 must be heated. Further, sufficient shrinkage of semiconductor chip 26 may eliminate the need to expand leadframe 20.

The third step is illustrated in flow diagram 10 by reference numeral 13 and comprises placing semiconductor chip 26 into opening 24 in such an orientation that edges 29 are adjacent edges 25 of die attach region 23. In other words semiconductor chip 26 is inserted into opening 24. Preferably, front side 27 is co-planar with the top surface of the leadframe 20. Methods for moving and placing semiconductor chips are well known in the art.

In the fourth step shown by reference numeral 14 of FIG. 1, opening 24 is contracted or shrunk such that edges 25 of the leadframe 20 grip corresponding edges 29 of semiconductor chip 26, i.e., leadframe 20 is compressed against semiconductor chip 26. Preferably, opening 24 is shrunk by cooling leadframe 20 to approximately room temperature, thereby contracting or shrinking leadframe 20 also. Thus, opening 24 is temporarily expanded. It shall be understood that the methods for expanding and contracting the leadframe are not limitations of the present invention. In other words, the leadframe may be expanded and contracted by mechanical means, such that the desired compressive stress secures a semiconductor substrate in a leadframe opening. Further, semiconductor chip 26 will not fall out of opening 24 due to expansion of leadframe 20 because the size of opening 24 is selected such that edges 25 grip edges 29 even at the worst case temperature conditions. It shall be understood that once semiconductor chip 26 is encapsulated, the encapsulating material serves to prevent semiconductor chip 26 from becoming detached from leadframe 20.

Figure 6:
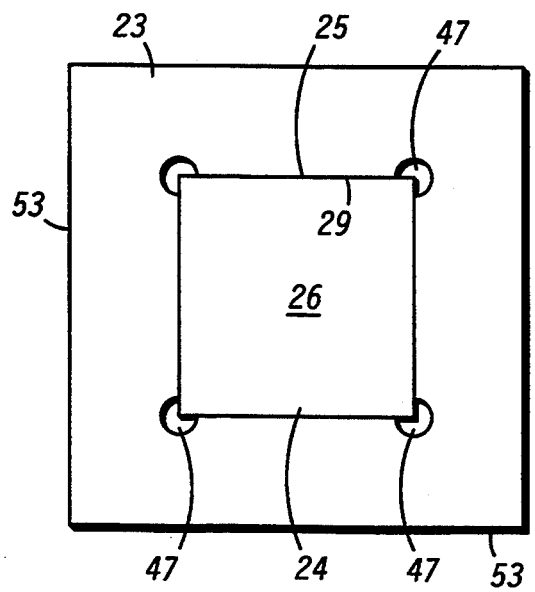
FIG. 6 illustrates a plan view of a semiconductor chip attached to a leadframe in accordance with the present invention.

FIG. 6 illustrates a plan view of a semiconductor chip 26 attached to a leadframe in accordance with the present invention. More particularly, FIG. 6 illustrates a die attach region 23 of leadframe 20 having semicircular notches 47 formed at each corner of opening 24. Semicircular notches 47 extend from edges 25 into leadframe 20 and notch out the corners formed by the intersections of adjacent edges 25 that are perpendicular to one another.

Semicircular notches 47 serve as corner relief structures during the expansion and the contraction of die attach region 23 of leadframe 20 as indicated by reference numerals 12 and 14, respectively, of flow diagram 10. In one example using a leadframe having a thickness of approximately 508 micrometers (20 mils), radial lines of semicircular notches 47 have a length of at least approximately 152 micrometers (6 mils). Semicircular notches 47 are made using a punch and die. Preferably semicircular notches 47 are made simultaneously. Techniques for making semicircular notches 47 using a punch and die are well known to those skilled in the art.

By now it should be appreciated that a method for nonadhesively securing or attaching a semiconductor chip to a leadframe has been provided. The method of the present invention takes advantage of the thermal properties of a leadframe material, e.g. copper, and a semiconductor material, e.g. silicon, to grip a semiconductor chip within an opening or cavity of the leadframe.

The present invention eliminates the need for die attach materials such as epoxy or lead based solders. The elimination of die attach materials decreases the number of processing steps and the materials required for attaching a semiconductor chip to a leadframe, resulting in a reduction in the costs associated with packaging semiconductor chips. A further advantage is the elimination of lead based solders, which pose environmental hazards. In addition, the absence of a liquid or molten die attach material precludes the inherent problems associated with the use of liquid die attach materials, e.g., chip tilting.

We claim:

1. A method for nonadhesively securing a semiconductor chip to a leadframe, comprising the steps of:
   providing the leadframe, wherein the leadframe has a semiconductor chip receiving region;
   forming a semiconductor chip receiving cavity in the semiconductor chip receiving region, the semiconductor chip receiving cavity having a first shape and a first area;
   providing the semiconductor chip, wherein the semiconductor chip has a second shape and a second area, the second shape corresponding to the first shape and the second area being larger than the first area;
   expanding the semiconductor chip receiving cavity such that the semiconductor chip receiving cavity has a third area, wherein the third area is larger than the second area;
   placing the semiconductor chip in the semiconductor chip receiving cavity; and
   shrinking the semiconductor chip receiving cavity.

2. A method for nonadhesively securing a semiconductor chip to a leadframe as claimed in claim 1, wherein the step of expanding the semiconductor chip receiving cavity includes heating the leadframe.

3. A method for nonadhesively securing a semiconductor chip to a leadframe as claimed in claim 1, wherein the step of expanding the semiconductor chip receiving cavity includes uniformly expanding the leadframe.

4. A method for nonadhesively securing a semiconductor chip to a leadframe as claimed in claim 1, wherein the step of shrinking the semiconductor chip receiving cavity includes cooling the leadframe.

5. A method for nonadhesively securing a semiconductor chip to a leadframe as claimed in claim 1, wherein the step of providing the leadframe includes providing the leadframe with a flag, the flag having the semiconductor chip receiving cavity.

6. A method for nonadhesively securing a semiconductor chip to a leadframe as claimed in claim 1, wherein the step of providing the leadframe includes providing a heatsink, the heatsink having the semiconductor chip receiving cavity.

7. A method for gripping a semiconductor substrate, comprising the steps of:
   providing the semiconductor substrate, wherein the semiconductor substrate has a major surface and is bounded along a periphery by an edge;
   providing a support, wherein the support has a major surface and a receptacle having an edge for gripping the edge of the semiconductor substrate, the edge of the receptacle substantially parallel to the edge of the semiconductor substrate; and
   gripping the edge of the semiconductor substrate with the edge of the receptacle, wherein the compressive stress on the semiconductor substrate is between approximately 100 and approximately 200 MegaPascals at room temperature.

8. A method for gripping a semiconductor substrate as claimed in claim 7, wherein the step of gripping the edge of the semiconductor substrate comprises:
   expanding the support such that the receptacle is larger than the semiconductor substrate;
   inserting the semiconductor substrate in the receptacle; and
   shrinking the support such that the edge of the receptacle grips the edge of the semiconductor substrate.

9. A method for gripping a semiconductor substrate as claimed in claim 7, further including providing the receptacle as an opening, the opening extending through the support.

10. A method for gripping a semiconductor substrate as claimed in claim 7, further including providing the receptacle as a recess having a floor and walls, and the step of gripping the edge of the semiconductor substrate includes placing the semiconductor substrate in the recess such that the semiconductor substrate rests on the floor, and compressing the walls against the edge of the semiconductor substrate.

11. A method for gripping a semiconductor substrate as claimed in claim 10, further including providing an aperture in the floor, the aperture extending through the floor.

12. A method for gripping a semiconductor substrate as claimed in claim 8, wherein expanding the support includes heating the support, and the step of shrinking the support includes cooling the support.

13. A method for gripping a semiconductor substrate as claimed in claim 7, further including gripping the edge of the semiconductor substrate such that the major surface of the semiconductor substrate is co-planar with the major surface of the support.

14. A method for gripping a semiconductor substrate as claimed in claim 7, wherein the step of gripping the edge of the semiconductor substrate comprises:
   shrinking the semiconductor substrate,
   expanding the support such that the receptacle is larger than the semiconductor substrate;
   inserting the semiconductor substrate in the receptacle;
   expanding the semiconductor substrate; and
   shrinking the support such that the edge of the receptacle grips the edge of the semiconductor substrate.

15. A method for gripping a semiconductor substrate as claimed in claim 7, further including providing the semiconductor substrate such that the semiconductor substrate has a rectangular shape and two opposing edges, providing the receptacle such that the receptacle has a corresponding rectangular shape and two opposing edges, and gripping each of the two opposing edges of the semiconductor substrate with the two opposing edges of the support that correspond with the two opposing edges of the semiconductor substrate.

16. A method for nonadhesively attaching a semiconductor substrate to a leadframe, comprising the steps of:
   providing the leadframe, wherein the leadframe has an opening, the opening being smaller than the semiconductor substrate;
   temporarily enlarging the opening;
   placing the semiconductor substrate in the opening; and
   shrinking the opening, wherein the step of shrinking the opening compresses the leadframe against the semiconductor substrate.

17. A method for nonadhesively attaching a semiconductor substrate to a leadframe as claimed in claim 16, further including expanding the opening by heating the leadframe and shrinking the opening by cooling the leadframe.

* * * * *